(12) United States Patent
Shoji et al.

(10) Patent No.: US 10,333,057 B2
(45) Date of Patent: Jun. 25, 2019

(54) HALL ELEMENT

(71) Applicant: ASAHI KASEI MICRODEVICES CORPORATION, Tokyo (JP)

(72) Inventors: Tomoya Shoji, Tokyo (JP); Tsuyoshi Akagi, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 15/928,390

(22) Filed: Mar. 22, 2018

(65) Prior Publication Data
US 2018/0277747 A1 Sep. 27, 2018

(30) Foreign Application Priority Data

Mar. 23, 2017 (JP) ................. 2017-058194

(51) Int. Cl.
| H01L 23/04 | (2006.01) |
| H01L 43/14 | (2006.01) |
| H01L 27/22 | (2006.01) |
| H01L 43/04 | (2006.01) |
| H01L 43/06 | (2006.01) |

(Continued)

(52) U.S. Cl.
CPC .............. *H01L 43/04* (2013.01); *G01R 33/07* (2013.01); *H01L 43/065* (2013.01); *H01L 23/04* (2013.01); *H01L 27/22* (2013.01); *H01L 43/10* (2013.01); *H01L 43/14* (2013.01); *H01L 2224/48091* (2013.01); *H01L 2224/48247* (2013.01); *H01L 2924/181* (2013.01); *H01L 2924/18165* (2013.01)

(58) Field of Classification Search
CPC ....... H01L 27/22; H01L 23/04; H01L 43/065; H01L 43/14
USPC ........................................................ 257/421
See application file for complete search history.

(56) References Cited

U.S. PATENT DOCUMENTS 4,123,772 A * 10/1978 Janssen ................. H01L 43/065
257/427
4,296,424 A * 10/1981 Shibasaki ........... H01L 21/3221
174/257

(Continued)

FOREIGN PATENT DOCUMENTS

| JP | S59-129483 A | 7/1984 |
| JP | S60-175471 A | 9/1985 |

(Continued)

*Primary Examiner* — George R Fourson, III
(74) *Attorney, Agent, or Firm* — Morgan, Lewis & Bockius LLP

(57) ABSTRACT

A hall element is provided to suppress fluctuation in a Hall output voltage of the hall element which is generated due to a fluctuation in stress. The hall element may be formed to include a substrate, a magnetosensitive portion formed on the substrate, an insulating film formed on the magnetosensitive portion, four conductive portions (electrode portions and contact portions) which are formed on the insulating film, electrically connected to the magnetosensitive portion through the insulating film, and disposed at positions serving as vertexes of a quadrangle, and ball portions electrically connected to the conductive portions, and at least one ball portion is disposed on a diagonal line of the quadrangle formed by a region surrounded by the four conductive portions and above a portion where the conductive portion and the insulating film are in contact with each other.

12 Claims, 5 Drawing Sheets

(51) Int. Cl.
    *G01R 33/07*    (2006.01)
    *H01L 43/10*    (2006.01)

(56) References Cited

U.S. PATENT DOCUMENTS

| | | | |
|---|---|---|---|
| 6,492,697 B1 * | 12/2002 | Plagens | G01R 33/07 |
| | | | 257/421 |
| 6,639,290 B1 * | 10/2003 | Hohe | G01D 3/02 |
| | | | 257/414 |
| 2003/0094943 A1 | 5/2003 | Ashley et al. | |
| 2005/0230827 A1 * | 10/2005 | Naito | G01R 33/02 |
| | | | 257/737 |
| 2015/0255709 A1 * | 9/2015 | Hebert | H01L 43/065 |
| | | | 257/427 |
| 2017/0062703 A1 | 3/2017 | Nakagawa et al. | |
| 2018/0108582 A1 * | 4/2018 | Yanagida | H01L 23/13 |

FOREIGN PATENT DOCUMENTS

| | | |
|---|---|---|
| JP | S62-012974 U1 | 1/1987 |
| JP | S62-088383 A | 4/1987 |
| JP | H03-211778 A | 9/1991 |
| JP | 2007005339 A * | 1/2007 |
| JP | 2012-204616 A | 10/2012 |

* cited by examiner

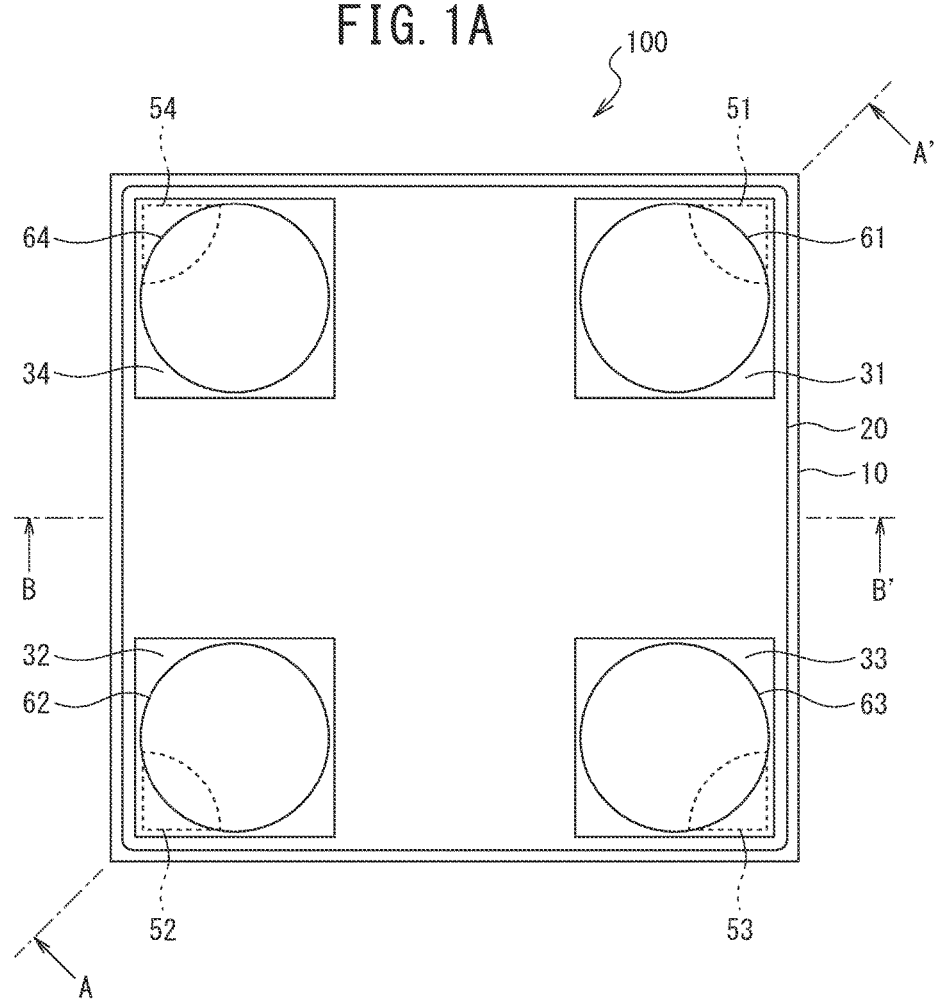
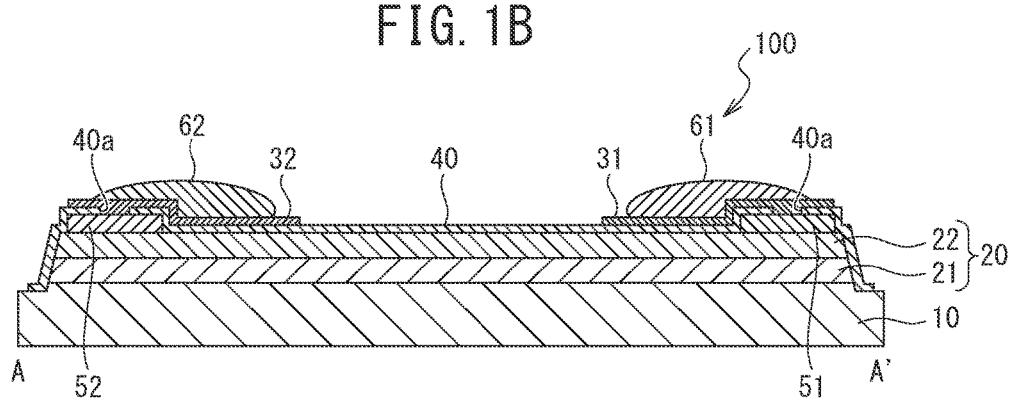

HALL ELEMENT

BACKGROUND OF THE INVENTION

Field of the Invention

The present invention relates to a hall element.

Description of the Related Art

In recent years, a hall element including a contact for connecting a magnetosensitive portion and an electrode pad to each other has been known (see for example, PTL 1 and PTL 2).

CITATION LIST

Patent Literature

PTL 1: JP 60-175471 A
PTL 2: JP 62-12974 A

SUMMARY OF THE INVENTION

In a hall element of the related art, a current is concentrated on a lower end of a contact. For this reason, when a deformation and the like occur in a mold resin covering the circumference of the body of the hall element due to changes in a temperature environment, and the like, a fluctuation in stress occurs in the body of the hall element due to the deformation, and thus there is a possibility that a local change in conductivity occurs. Particularly, in a case where a fluctuation in stress occurs in the vicinity of the circumference of the contact on which a current is concentrated, there is a possibility that a fluctuation occurs in an offset voltage of a Hall output, which results in a variation in a Hall output voltage.

Consequently, the invention is contrived in view of unsolved problems of the related art, and an object thereof is to provide a hall element capable of suppressing a fluctuation in a Hall output voltage caused by a fluctuation in stress due to a change in temperature environment, and the like.

In order to accomplish the above-described object, according to an aspect of the invention, there is provided a hall element including a substrate, a magnetosensitive portion configured to be formed on the substrate, an insulating film configured to be formed on the magnetosensitive portion, four conductive portions configured to be formed on the insulating film and electrically connected to the magnetosensitive portion through the insulating film, and ball portions configured to be electrically connected to the conductive portions, in which at least one of the ball portions is disposed on a diagonal line of a quadrangle formed by a region surrounded by the four conductive portions and is disposed above a portion where the conductive portion and the insulating film are in contact with each other.

According to an aspect of the invention, a fluctuation in stress accompanied by a change in temperature environment, and the like is suppressed by a ball portion, and thus it is possible to suppress a fluctuation in a Hall output voltage caused by the fluctuation in stress and to suppress a variation in the Hall output voltage.

BRIEF DESCRIPTION OF DRAWINGS

FIG. 1A is a top view illustrating an example of a hall element according to an embodiment of the invention.

FIG. 1B is a cross-sectional view taken along line A-A' of FIG. 1A.

DESCRIPTION OF THE PREFERRED EMBODIMENTS

Figure 1C:
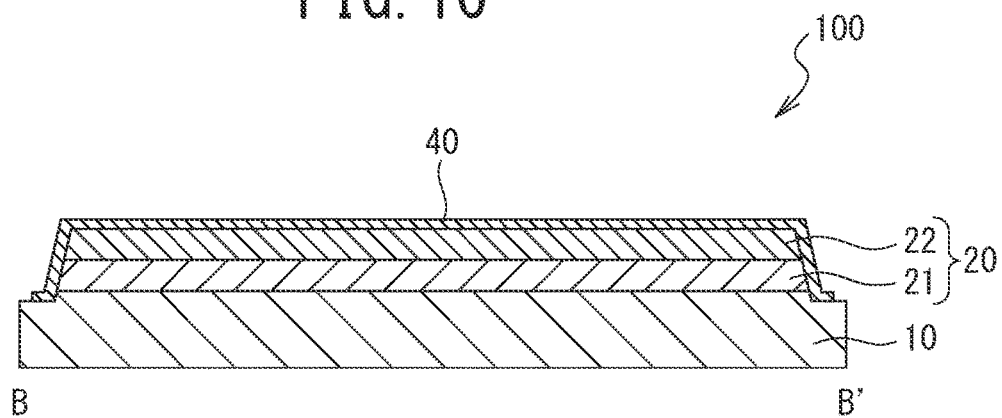
FIG. 1C is a cross-sectional view taken along line B-B' of FIG. 1A.

In the following detailed description, many specific concrete configurations are described so as to provide the complete understanding of an embodiment of the invention. However, it is apparent that the invention is not limited to such specific concrete configurations, and other embodiments can be implemented. In addition, the following embodiment does not limit the invention according to claims, and includes all combinations of characteristic configurations described in the embodiment.

Hereinafter, an embodiment of the invention will be described with reference to the accompanying drawings. In the following description of the drawings, the same portions are denoted by the same reference numerals and signs. However, the drawings are schematic drawings, and a relationship between a thickness and a planar dimension, a thickness ratio in layers, and the like are different from those in real life.

Embodiment

FIG. 1A is a top view illustrating an example of a hall element 100 according to an embodiment of the invention. FIG. 1B is a cross-sectional view taken along line A-A' of FIG. 1A. FIG. 1C is a cross-sectional view taken along line B-B' of FIG. 1A.

The hall element 100 according to the embodiment of the invention includes a substrate 10, a magnetosensitive portion 20, electrode portions 31 to 34, an insulating film 40, contact portions 51 to 54, and ball portions 61 to 64. The magnetosensitive portion 20 includes a conductive layer 21 and a surface layer 22. The electrode portions 31 to 34 and the contact portions 51 to 54 constitute a conductive portion.

The substrate 10 is a semiconductor substrate such as Si or a compound semiconductor. The substrate 10 according to the embodiment of the invention is, for example, a GaAs substrate. A specific resistance of the substrate (GaAs substrate) 10 is equal to or greater than $1.0 \times 10^5$ Ω·cm. An upper limit of the specific resistance of the substrate 10 may be equal to or less than $1.0 \times 10^9$ Ω·cm. The substrate 10 has, for example, substantially a square planar shape. Meanwhile, the planar shape of the substrate 10 is not limited to substantially a square shape and can be arbitrarily set. The substrate has a planar shape which is similar to and larger than, for example, the planar shape of the magnetosensitive portion 20.

The magnetosensitive portion 20 is formed on the substrate 10. The magnetosensitive portion 20 may be formed on the substrate 10 so as to be partially embedded into the substrate 10. The magnetosensitive portion 20 has substantially a square planar shape.

The magnetosensitive portion 20 is a layer having resistance lower than that of the substrate 10. The magnetosensitive portion 20 is formed of a compound semiconductor such as GaAs, InSb, and InAs. The magnetosensitive portion 20 according to the embodiment of the invention is formed of GaAs. In addition, the magnetosensitive portion 20 may be activated by injecting impurities, such as Si, Sn, S, Se, Te, Ge, and C, into the substrate 10 and heating the substrate. In addition, the magnetosensitive portion 20 may have a planar shape in which at least one corner thereof is rounded. A current flowing to the hall element 100 may be concentrated on an end of the magnetosensitive portion 20. The planar shape of the magnetosensitive portion 20 has a round portion, and thus the concentration of a current on the end of the magnetosensitive portion 20 is alleviated. Meanwhile, this effect becomes remarkable when the magnetosensitive portion 20 is formed on the substrate 10 in a step shape (mesa shape). Particularly, a corner portion of the magnetosensitive portion 20 has a radius of curvature equal to or higher than 10% with respect to the thickness of the magnetosensitive portion 20, and thus it is possible to alleviate the concentration of a current on the end of the magnetosensitive portion 20, which leads to a preferable effect. In addition, the corner portion has a radius of curvature equal to or less than 10000% with respect to the thickness of the magnetosensitive portion 20, and thus it is possible to suppress fluctuation in an output voltage of the hall element 100, which leads to a preferable effect. It is possible to reduce the exposure of a surface other than a surface (for example, a (100) surface) having the lowest dangling bond on the side surface of the magnetosensitive portion 20, and thus it is inferred that the surface recoupling of carriers hardly occurs.

Meanwhile, the magnetosensitive portion 20 is not limited to substantially a square shape. The entire region surrounded by the four contact portions 51 to 54 may be included in the magnetosensitive portion 20.

The magnetosensitive portion 20 is formed to have substantially a square shape or is formed to have a shape in which the entire region surrounded by the four contact portions 51 to 54 is included in the magnetosensitive portion 20, and thus the magnetosensitive portion can be formed to have a shape in which a current is hardly concentrated. In addition, it is possible to maximize the area of the magnetosensitive portion 20 with respect to the substrate 10. Thereby, this is preferable in that it is possible to suppress 1/f noise and to suppress fluctuation in output characteristics of the hall element 100.

When the entire region surrounded by the four contact portions is included in the magnetosensitive portion 20, the magnetosensitive portion 20 may be expanded to the outside of the region surrounded by the four contact portions. For example, the edge portion of the magnetosensitive portion 20 may not be a straight line, and a notch or the like may be formed in the edge portion of the magnetosensitive portion 20. On the other hand, in a case where the notch formed in the edge portion of the magnetosensitive portion 20 is relatively large and the entire region surrounded by the four contact portions 51 to 54 is formed to have a shape not included in the magnetosensitive portion 20 (a so-called cross shape), a current is easily concentrated in the vicinity (that is, a cross intersection portion) of the notch. For this reason, 1/f noise may be increased.

The region surrounded by the four contact portions 51 to 54 can be determined as follows. First, the center of gravity of the magnetosensitive portion 20 when seen in a top view is set to be the center of the magnetosensitive portion 20. Next, a point at which a distance between the center of the magnetosensitive portion 20 and each of the contact portions 51 to 54 is minimized is drawn in each of the contact portions 51 to 54. A region formed by connecting the points to each other is set to be the region surrounded by the four contact portions 51 to 54. Meanwhile, in a case where each of the contact portions includes a plurality of points at which a distance from the center of the magnetosensitive portion 20 is minimized, a region formed by connecting all of the points to each other is set to be the region surrounded by the four contact portions 51 to 54. In a case where a contact portion used for neither input nor output is present, the above-described region may be determined without considering the contact portion.

The conductive layer 21 is formed on the substrate 10. The conductive layer 21 according to the embodiment of the invention is n-type GaAs. The film thickness of the conductive layer 21 is not particularly limited. The film thickness of the conductive layer 21 according to the embodiment of the invention is equal to or greater than 50 nm and equal to or less than 2000 nm. The film thickness of the conductive layer 21 may be equal to or greater than 100 nm and equal to or less than 1000 nm.

The surface layer 22 is formed of a conductive material on the conductive layer 21. The surface layer 22 is constituted of high-resistance crystal, such as a GaAs layer, AlGaAs, or AlAs, which has a conductivity lower than that of the conductive layer 21. The film thickness of the surface layer 22 according to the embodiment of the invention is equal to or greater than 150 nm. The film thickness of the surface layer 22 may be equal to or greater than 200 nm. An upper limit of the film thickness of the surface layer 22 may be equal to or less than 800 nm or may be equal to or less than 600 nm. Meanwhile, the surface layer 22 may not be formed in the magnetosensitive portion 20.

The insulating film 40 is formed so as to cover the upper surface and side surface of the magnetosensitive portion 20. The insulating film 40 according to the embodiment of the invention is formed so as to cover the entire surface layer 22 and the entire side surface of a stacked body of the conductive layer 21 and the surface layer 22 and to be in contact with the upper surface of the substrate 10.

An opening 40a for contact is provided in the insulating film 40. The thickness of the insulating film 40 is, for example, equal to or greater than 100 nm, but is not limited thereto. The insulating film 40 is, for example, a silicon nitride film ($Si_3N_4$ film), a silicon oxide film ($SiO_2$ an alumina film ($Al_2O_3$), a polyimide film, or a multilayer film in which at least one of these films is stacked. Meanwhile, in the top view illustrated in FIG. 1A, the insulating film 40 is omitted for convenience of description.

The electrode portions 31 to 34 are formed on the insulating film 40. For example, the electrode portion 31 and the electrode portion 32 are electrode portions for input for applying a current to the magnetosensitive portion 20, and the electrode portion 33 and the electrode portion 34 are electrode portions for output for detecting a Hall voltage of the magnetosensitive portion 20. Here, a description is given on the assumption that the electrode portion 31 and the electrode portion 32 are electrode portions for input, and the electrode portion 33 and the electrode portion 34 are electrode portions for output, but the electrode portions for input and the electrode portions for output may be switched with each other. In addition, the electrode portions for input and the electrode portions for output may be sequentially switched with each other to make the hall element 100 perform a spinning current operation. Meanwhile, the hall element 100 may include an electrode portion, in addition to the electrode portions 31 to 34.

The electrode portions 31 to 34 are electrically connected to the magnetosensitive portion 20 via the contact portions 51 to 54 through the opening 40a provided in the insulating film 40. The electrode portions 31 to 34 are formed of a conductive material such as a metal or polysilicon. The electrode portions 31 to 34 according to the embodiment of the invention contain gold as a main component.

The electrode portions 31 to 34 are formed on the corresponding contact portions 51 to 54 when seen in a top view. Since the contact portions 51 to 54 are disposed at positions which are vertexes of substantially a square shape as described later, the electrode portions 31 to 34 disposed on the contact portions 51 to 54 are also disposed at positions which are vertexes of substantially a square shape.

In addition, the electrode portions 31 to 34 are formed so as to extend in a direction toward the opposite electrode portions on a diagonal line and in a direction toward each of the adjacent electrode portions on both sides thereof when seen with the corresponding contact portions 51 to 54 as reference points. The electrode portions 31 to 34 according to the embodiment of the invention each have, for example, substantially a square planar shape, and the corner portion of each of the electrode portions 31 to 34 and the corner portion of the magnetosensitive portion 20 respectively have shapes similar to each other. Further, the electrode portions 31 to 34 and the magnetosensitive portion 20 are disposed so that the sides thereof are parallel to each other. In addition, the outer circumference of each of the electrode portions 31 to 34 is positioned on the inner side of a region surrounded by the outer circumference of the magnetosensitive portion 20 when seen in a top view. The sizes of the electrode portions 31 to 34 will be described later.

Here, in a case where the electrode portions 31 to 34 are formed in the upper portion of the magnetosensitive portion 20, the magnetosensitive portion 20 is configured such that at least one corner thereof is rounded, and thus it is possible to prevent the effects of chipping.

That is, dicing is performed when dividing the substrate 10 into individual pieces. However, in a case where the electrode portions 31 to 34 are not disposed between the outer circumferential portion of the substrate 10 and the outer circumferential portion of the magnetosensitive portion 20, the magnetosensitive portion 20 is broken due to chipping, and the concentration of a current due to the breakage may occur. Particularly, in a case where the corner of the magnetosensitive portion 20 is not rounded, stress from the insulating film 40 and stress during the dicing are concentrated on the corner of the magnetosensitive portion, and thus may become a starting point of a crack. In a case where at least one corner of the magnetosensitive portion 20 is rounded, the stress and the like are alleviated, and the breakage of the end of the magnetosensitive portion 20 due to chipping is suppressed, whereby it is possible to alleviate the concentration of a current.

Meanwhile, the electrode portions 31 to 34 according to the embodiment of the invention have the same planar shape, but may have different planar shapes. For example, the electrode portions for input and the electrode portions for output may be configured to have different planar shapes.

In addition, the electrode portions 31 to 34 according to the embodiment of the invention are formed within the region of the magnetosensitive portion 20 when seen in a top view, but at least a portion of the electrode portions may extend to the outside of the region of the magnetosensitive portion 20 when seen in a top view. Meanwhile, when the electrode portions 31 to 34 are formed within the region of the magnetosensitive portion 20 when seen in a top view, it is possible to reduce fluctuations in an output voltage of the hall element 100, which leads to a preferable effect. This is because stress due to a difference in thermal expansion coefficient between the magnetosensitive portion 20 and the electrode portions 31 to 34 is hardly applied to the magnetosensitive portion 20.

The contact portions 51 to 54 are formed on the magnetosensitive portion 20. The contact portions 51 to 54 according to the embodiment of the invention electrically connect the electrode portions 31 to 34 and the magnetosensitive portion 20 to each other through the insulating film 40. In the embodiment of the invention, the contact portions 51 to 54 are formed at positions which are vertexes of substantially a square shape. Meanwhile, the positions where the contact portions 51 to 54 are disposed are not limited to the positions which are vertexes of substantially a square shape, and may be positions which are vertexes of a quadrangle.

The electrode portions 31 to 34 are formed on the contact portions 51 to 54.

The contact portions 51 to 54 according to the embodiment of the invention are formed of, for example, the same materials as those of the electrode portions 31 to 34. The electrode portions 31 to 34 and the contact portions 51 to 54 may be integrally formed as conductive portions at the same time by the same process. Meanwhile, the contact portions 51 to 54 may be formed of materials different from those of the electrode portions 31 to 34.

Each of the contact portions 51 to 54 has a planar shape based on the planar shape of the magnetosensitive portion 20, and is formed to have such a size that the magnetosensitive portion 20 and each of the corresponding electrode portions 31 to 34 can be electrically connected to each other. The planar shape of each of the contact portions 51 to 54 is, for example, substantially a triangular shape similar to the corner portion of the magnetosensitive portion 20, and the contact portions 51 to 54 are formed such that three vertexes thereof vertically face a region outside the vertexes of the magnetosensitive portion 20 and two of three sides thereof are parallel to two sides of the magnetosensitive portion 20.

In addition, the planar shape of each of the contact portions 51 to 54 may have a rounded portion in at least a portion of the outer region corresponding to the outer circumferential side of the magnetosensitive portion 20. In addition, the planar shape of each of the contact portions 51 to 54 may have a rounded portion in the inner region on the central side of the magnetosensitive portion 20, and may have, for example, a fan shape as a whole. Thereby, the concentration of a current at the ends of the contact portions 51 to 54 is alleviated. The planar shape of each of the contact portions 51 to 54 is not limited to the fan shape and may be another shape as long as the concentration of a current at the ends of the contact portions 51 to 54 can be alleviated. Meanwhile, the outer region mentioned herein refers to the outer circumference of each of the contact portions 51 to 54, and indicates a region facing the outer circumference of the magnetosensitive portion 20. On the other hand, the inner region indicates a region on the central side of the magnetosensitive portion 20 other than the outer region. In a case where the entire region surrounded by the four contact portions 51 to 54 is included in the magnetosensitive portion 20, the amount of current flowing to the ends of the contact portions 51 to 54 is particularly increased, and thus a remarkable effect of alleviating the concentration of a current is obtained.

Figure 2:
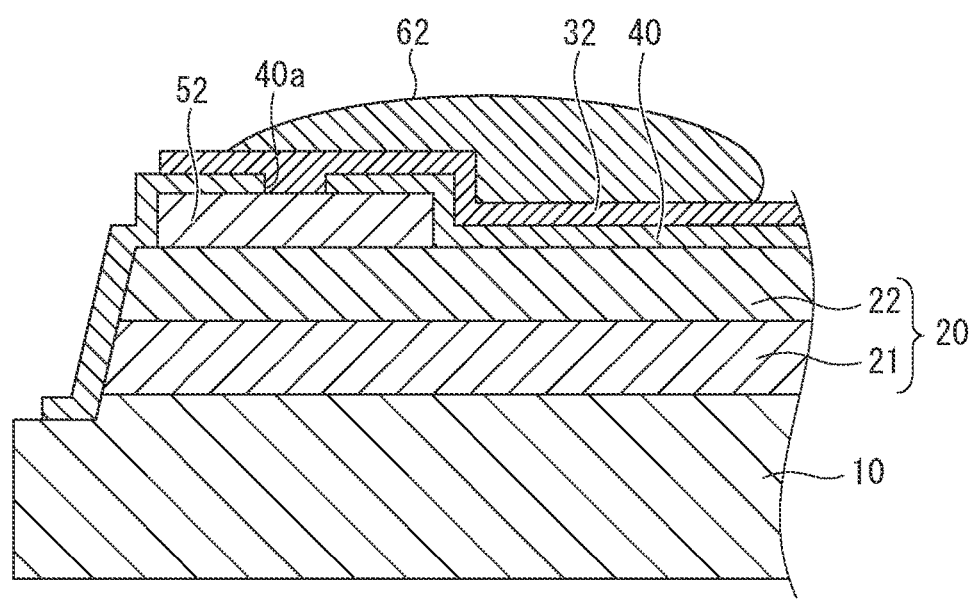
FIG. 2 is an enlarged view of an electrode portion of FIG. 1B.

FIG. 2 is an enlarged view of the electrode portion 32 of FIG. 1B.

The ball portions 61 to 64 are formed on the electrode portions 31 to 34. The ball portions 61 to 64 are formed of a conductive material, and are electrically connected to the electrode portions 31 to 34. The ball portions 61 to 64 may be formed of the same material as that of a bonding wire for connection to the outside. In addition, the ball portions 61 to 64 may be configured such that a bonding portion between the bonding wire and each of the electrode portions 31 to 34 may be made thicker than the bonding wire when bonding the bonding wire to the electrode portions 31 to 34 during mounting and the like, and the thickened bonding portion to each of the electrode portions 31 to 34 may be configured as a ball portion, and only the ball portions 61 to 64 may be formed on the electrode portions 31 to 34 by using a wire bump forming method. The ball portions 61 to 64 are, for example, gold balls.

The ball portion 61 is formed on a diagonal line of a quadrangle formed by the region surrounded by the four contact portions 51 to 54 and on a portion where the contact portion and the insulating film 40 are in contact with each other.

In addition, the ball portion 61 is formed at a position where a point on the contact portion 51 and a contact surface between the electrode portion 31 and the ball portion 61 overlap each other when seen in a top view, wherein the point is a point where a distance between the contact portion 51 and the contact portion 52 which are positioned on the diagonal line is the shortest. Similarly, each of the other ball portions 62 to 64 is formed at a position where a point on each of the corresponding electrode portions 32 to 34 and a contact surface between each of the corresponding electrode portions 32 to 34 and each of the corresponding ball portions 62 to 64 overlap each other when seen in a top view, wherein the point is a point where a distance between the contact portions positioned on the diagonal line is the shortest.

Meanwhile, the region surrounded by the four contact portions 51 to 54 can be determined as described above. As described above, in a case where the region surrounded by the four contact portions 51 to 54 is determined and only one point at which a distance from the center of the magnetosensitive portion 20 is the shortest is present for each contact portion, the "quadrangle formed by the region surrounded by the four contact portions 51 to 54" is equivalent to the region surrounded by the four contact portions 51 to 54. In a case where a plurality of points at which a distance from the center of the magnetosensitive portion 20 is the shortest is present for the contact portion, any one point of the plurality of points is selected for one contact portion, and it is assumed that a region surrounded by a line segment connecting a total of four points is determined to be the "quadrangle formed by the region surrounded by the four contact portions 51 to 54", wherein each of the four points is for each contact portion.

In FIG. 1A, the width of each of the electrode portions 31 to 34 is substantially equal to the diameter of each of the corresponding ball portions 61 to 64, and the proportion of the ball portions 61 to 64 in the electrode portions 31 to 34 is comparatively large. However, the sizes of the ball portions 61 to 64 are not limited thereto. Each of the ball portions 61 to 64 may have such a size that a point on each of the corresponding electrode portions 31 to 34 and a contact surface between each of the electrode portions 31 to 34 and each of the ball portions 61 to 64 overlap each other when seen in a top view, and may protrude from each of the corresponding electrode portions 31 to 34, wherein the point is a point where a distance between the contact portions positioned on the diagonal line is the shortest.

The electrode portions 31 to 34 are set to have such a size that the electrode portions 31 to 34 and the ball portions 61 to 64 can be electrically connected to each other, that the areas of the electrode portions are minimized, or that the areas thereof are slightly larger than the minimized areas, when the ball portions 61 to 64 are respectively formed on the electrode portions 31 to 34.

It is preferable that the electrode portions 31 to 34 are formed such that the areas thereof are further reduced, that is, a distance between the electrode portions facing each other is further increased. This is because regions of the electrode portions 31 to 34 which extend with the corresponding contact portions 51 to 54 as reference points are configured as a stacked structure of the electrode portions 31 to 34, the insulating film 40 and the magnetosensitive portion 20, and thus there is a possibility that parasitic capacitance is generated. The parasitic capacitance affects output characteristics of the hall element 100. It is possible to reduce the parasitic capacitance by reducing the areas of the electrode portions 31 to 34, that is, reducing the regions of the electrode portions 31 to 34 which extend with the corresponding contact portions 51 to 54 as reference points and reducing the area of the stacked structure of the electrode portions 31 to 34, the insulating film 40, and the magnetosensitive portion 20, and thus it is possible to reduce variations in the output characteristics, which leads to a preferable effect.

Meanwhile, the ball portions 61 to 64 being disposed as described above can be confirmed from the fact that, for example, at least one of the contact portions 51 to 54 is hidden by the ball portion when the hall element 100 is visually observed by an optical microscope, a scanning electron microscope (SEM), or the like when seen in a top view, or the fact that the ball portion is formed on a portion where the contact portion and the insulating film 40 are in contact with each other when the cross-section of the hall element 100 which includes the substrate 10, the magnetosensitive portion 20, the electrode portion, the insulating film 40, and the contact portion, for example, the cross-section taken along line A-A' of FIG. 1A is observed by an SEM.

Figure 3A:
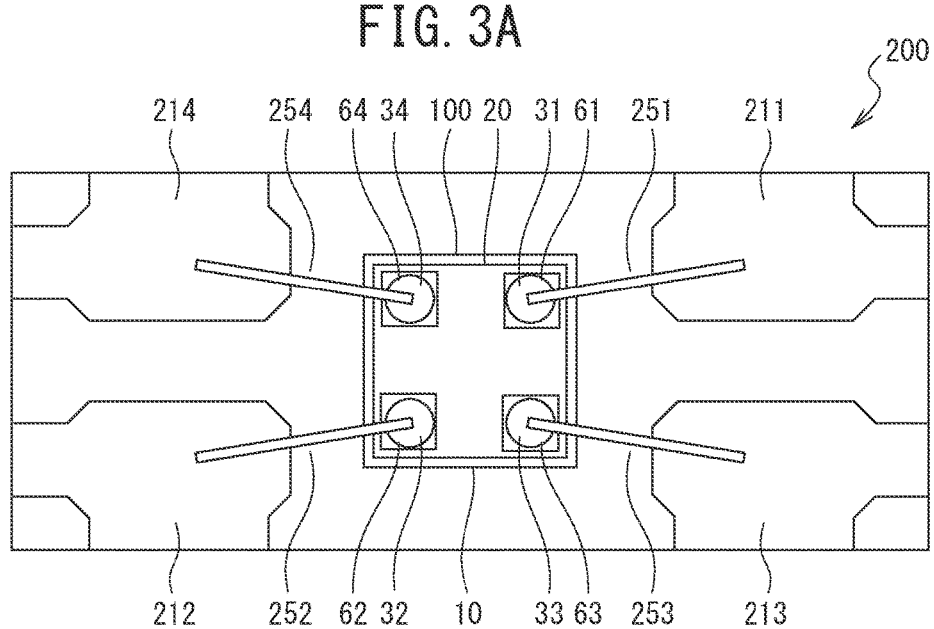
FIG. 3A is a top view illustrating an example of a Hall sensor.
Figure 3B:
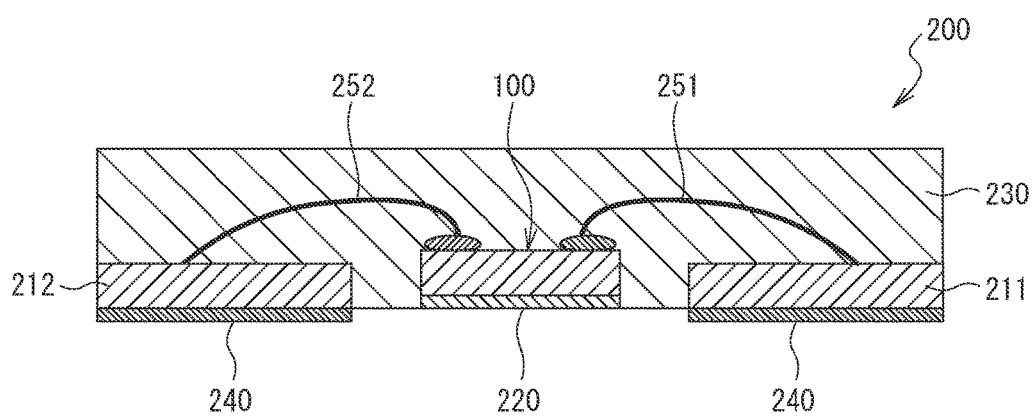
FIG. 3B is a schematic diagram illustrating an example of the cross-section of the Hall sensor.

FIG. 3A is a top view illustrating an example of a Hall sensor 200 using the hall element 100 according to the embodiment of the invention. FIG. 3B is a schematic diagram illustrating an example of the cross-section of the Hall sensor 200.

The Hall sensor 200 includes the hall element 100, lead terminals 211 to 214, a protection layer 220, a mold member 230, an external plated layer 240, and bonding wires 251 to 254. Meanwhile, the configuration of the Hall sensor 200 is an example, and is not limited thereto.

The hall element 100 is connected to the lead terminals 211 to 214 through the bonding wires 251 to 254. The electrode portion 31 is electrically connected to the lead terminal 211 by the bonding wire 251 through the ball portion 61. The electrode portion 32 is electrically connected to the lead terminal 212 by the bonding wire 252 through the ball portion 62. The electrode portion 33 is electrically connected to the lead terminal 213 by the bonding wire 253 through the ball portion 63. The electrode portion 34 is electrically connected to the lead terminal 214 by the bonding wire 254 through the ball portion 64.

The bonding wires 251 to 254 are formed of a conductive material. For example, a gold wire can be applied as the bonding wires 251 to 254, but the invention is not limited thereto. The bonding wires 251 to 254 are covered with the mold member 230. Thereby, the bonding wires 251 to 254 are fixed.

Meanwhile, a ball portion may be provided between the electrode portions 31 to 34 and each of the bonding wires 251 to 254. The ball portion is formed of a conductive material. The ball portion may be formed of the same material as those of the bonding wires 251 to 254. The ball portion is, for example, a gold ball or a solder ball. In an example, the ball portion has a diameter equal to or greater than 10 μm and equal to or less than 100 μm, for example, a diameter of 60 μm when seen in a top view. Meanwhile, in a case where the ball portion is not a perfect circle when seen in a top view, the ball portion is close to an oval having the same area as that of the ball portion when seen in a top view, and the major axis of the oval may be set to be a diameter. In addition, the thickness of the ball portion is preferably equal to or greater than 5 μm from a viewpoint of alleviating stress. In addition, the thickness of the ball portion is preferably equal to or less than 100 μm from a viewpoint of facilitating manufacture. Meanwhile, the thickness of the ball portion means a distance between the highest portion of the ball portion and each of the electrode portions 31 to 34 in which the ball portion is disposed.

Here, when a transmission view of a cross-section obtained by roentgenography of the Hall sensor 200 is observed, a portion having a width larger than the thickness of the bonding wire may be defined as a ball portion in a case where the bonding wire 252 is followed from the lead terminal 212 side to the hall element 100 side.

The lead terminals 211 to 214 are electrically connected to the outside through the external plated layer 240. In the lead terminals 211 to 214, the external plated layer 240 is formed on a surface opposite to a surface connected to each of the bonding wires 251 to 254. Thereby, the hall element 100 is electrically connected to the outside of the Hall sensor 200. Meanwhile, the external plated layer 240 is formed of, for example, tin (Sn), but is not limited thereto.

The protection layer 220 covers a surface opposite to a surface connected to each of the bonding wires 251 to 254 of the hall element 100. The material of the protection layer 220 is not limited as long as the material can protect, for example, the substrate 10. The protection layer 220 may be a film constituted of any one of a conductor, an insulator, or a semiconductor, or may be a film including two or more thereof. In a case of the conductor, the protection layer 220 may be a conductive resin such as silver paste. In a case of the insulator, the protection layer 220 may be an insulating paste containing an epoxy-based thermosetting resin and silica ($SiO_2$), a silicon nitride, a silicon dioxide, or the like. In a case of the semiconductor, the protection layer 220 may be formed by bonding a Si substrate or a Ge substrate.

The mold member 230 molds the hall element 100, the bonding wires 251 to 254, and the lead terminals 211 to 214. The mold member 230 is formed of a material capable of withstanding intense heat during reflowing. For example, the mold member 230 is formed of an epoxy-based thermosetting resin.

Here, in the Hall sensor 200, when the mold member 230 is deformed due to changes in a temperature environment, and the like, the hall element 100 is easily influenced by changes in stress. In particular, a current is easily concentrated on a portion of the contact portion where a distance between the contact portions positioned on the diagonal line is the shortest, that is, the inner region of the contact portion. For this reason, when a fluctuation in stress occurs in the inner end of the contact portion, the resistance of the magnetosensitive portion 20 changes due to a piezo resistance effect. As a result, the output characteristics of the hall element 100 are influenced, and thus there is a possibility that a fluctuation in an offset voltage, and the like occur.

In the hall element 100 according to the embodiment of the invention, the ball portions 61 to 64 are formed to overlap the inner region of the contact portion on which a current is easily concentrated, when seen in a top view. For this reason, even when a fluctuation in stress occurs due to the deformation of the mold member 230, and the like which are caused by changes in a temperature environment, and the like, the transmission of the fluctuation in stress to the inner region of the contact portion is suppressed by the ball portions 61 to 64. For this reason, even when a fluctuation in stress occurs in the mold member 230 due to the deformation of the mold member 230, and the like which are accompanied by changes in a temperature environment, and the like, it is possible to suppress fluctuations in the output characteristics of the hall element 100. Further, in a case where the entire region surrounded by the four contact portions 51 to 54 is included in the magnetosensitive portion 20, the amount of current flowing to the ends of the contact portions 51 to 54 is particularly increased, and thus a remarkable effect of suppressing an output fluctuation by the alleviation of stress is obtained. In a case where the magnetosensitive portion 20 is formed on the substrate 10 in a step shape (mesa shape), stress caused by the mold member 230 and the like is concentrated in the vicinity of a boundary between the substrate 10 and the magnetosensitive portion 20. Accordingly, an effect of alleviating stress by the ball portions 61 to 64 is increased, and thus it is possible to suppress fluctuations in the output characteristics of the hall element 100.

In addition, the ball portions 61 to 64 are essential portions when the lead terminals 211 to 214 and the electrode portions 31 to 34 are connected to each other by the bonding wires 251 to 254. In the hall element 100 according to the embodiment of the invention, the ball portions 61 to 64 for connecting the electrode portions 31 to 34 to the bonding wires 251 to 254 are appropriated as protection members for reducing the influence of the fluctuation in stress. For this reason, this can be realized without adding a process, a component, and the like for additionally providing the protection members for reducing the influence of the fluctuation in stress, and it is possible to suppress the influence of the fluctuation in stress while suppressing an increase in the cost due to the realization.

[Manufacturing Method]

FIGS. 4A to 4G are cross-sectional views illustrating an example of a process of manufacturing the hall element 100. Meanwhile, a method of manufacturing the hall element 100 is not limited thereto. Meanwhile, here, a description is given on the assumption that the contact portions 51 to 54 are contact portions 50.

Figure 4A:
FIG. 4A is an example of a cross-sectional view illustrating a process of manufacturing the hall element.

First, a large-sized substrate which is divided into a plurality of pieces to serve as the substrate 10 is prepared (FIG. 4A). The planar shape of the substrate 10 divided into individual pieces is, for example, substantially a square shape.

Figure 4B:
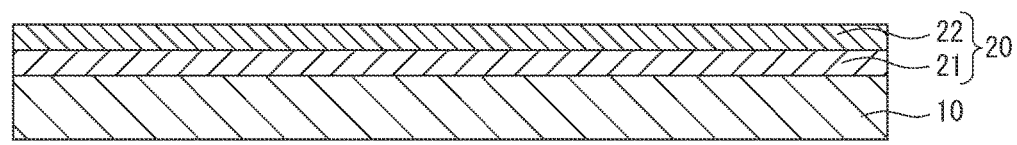
FIG. 4B is an example of a cross-sectional view illustrating a process of manufacturing the hall element.

Next, the magnetosensitive portion 20 is formed on the substrate 10 (FIG. 4B). Specifically, the conductive layer 21 is formed on the substrate 10, and the surface layer 22 is formed on the conductive layer 21. In a film forming step of the magnetosensitive portion 20, the planar shape of each of the conductive layer 21 and the surface layer 22 may be the same as the planar shape of the substrate 10. For example, the magnetosensitive portion 20 is formed by epitaxially growing a compound semiconductor on the substrate 10 by using a Metal Organic Chemical Vapor Deposition (MOCVD) method or a molecular beam epitaxy (MBE) method.

Figure 4C:
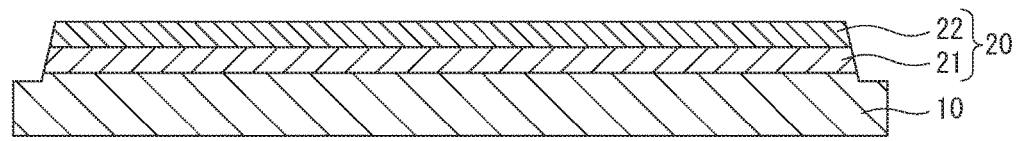
FIG. 4C is an example of a cross-sectional view illustrating a process of manufacturing the hall element.
Figure 4D:
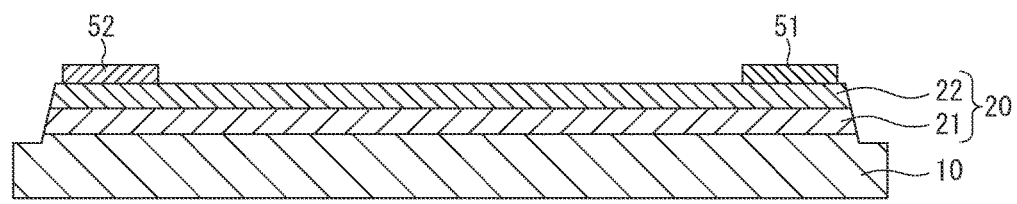
FIG. 4D is an example of a cross-sectional view illustrating a process of manufacturing the hall element.

Next, in FIG. 4C, the magnetosensitive portion 20 is etched to a pattern of a planar shape which is determined in advance. Thereby, the magnetosensitive portion 20 is formed to have substantially a square planar shape. In addition, the corner portion of the planar shape of the magnetosensitive portion 20 may be rounded by the etching process. Next, in FIG. 4D, the contact portion 50 is formed on the magnetosensitive portion 20. The contact portion 50 is formed using any semiconductor manufacturing process such as deposition and sputtering. The contact portion 50 is formed in the vicinity of the corner portion of the magnetosensitive portion 20.

Figure 4E:
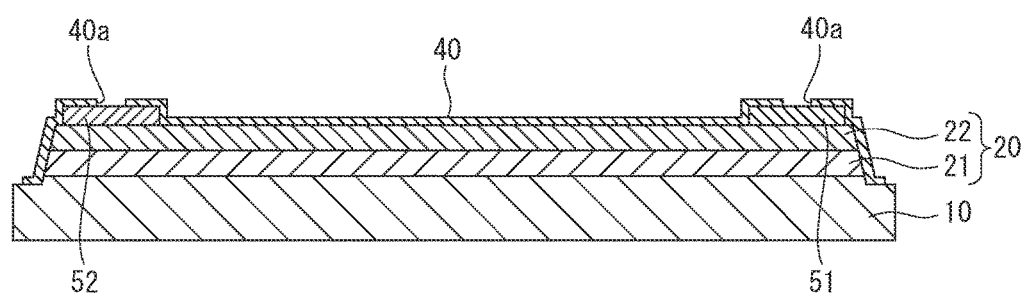
FIG. 4E is an example of a cross-sectional view illustrating a process of manufacturing the hall element.

Next, in FIG. 4E, the insulating film 40 is formed on the substrate 10, the magnetosensitive portion 20, and the contact portion 50. For example, a SiN film having a thickness of 300 nm is formed as the insulating film 40. In addition, the opening 40a for electrically connecting the contact portion 50 and the electrode portions 31 to 34 to each other is formed in the insulating film 40. The opening 40a may be formed by an etching process.

Figure 4F:
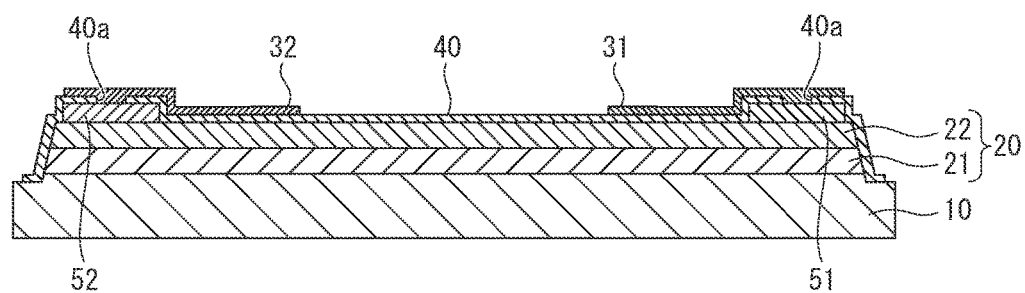
FIG. 4F is an example of a cross-sectional view illustrating a process of manufacturing the hall element.

Next, in FIG. 4F, the electrode portions 31 to 34 are formed on the insulating film 40. In addition, the electrode portions 31 to 34 are electrically connected to the contact portion 50 through the opening 40a formed in the insulating film 40. In an example, the thickness of each of the electrode portions 31 to 34 is 0.5 μm, but is not limited thereto.

Figure 4G:
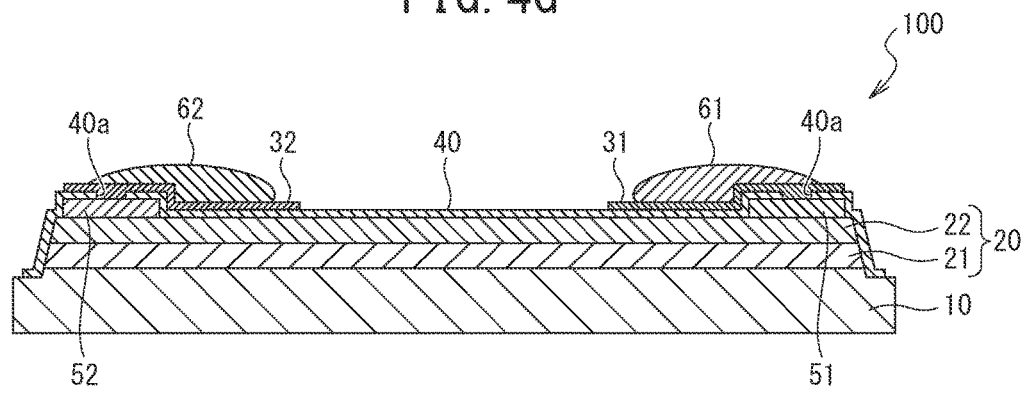
FIG. 4G is an example of a cross-sectional view illustrating a process of manufacturing the hall element.

Subsequently, in FIG. 4G, the ball portions 61 to 64 are formed using a wire bump forming method such as a wire bumping method and a stud bump bonding method. Alternatively, the ball portions 61 to 64 are formed on the electrode portions 31 to 34 by forming a ball in a tip end of a wire and bonding the ball to the electrode portions 31 to 34 when performing wire bonding. At this time, the ball portions 61 to 64 are formed at positions where the inner region of the contact portion positioned on the diagonal line and the ball portions 61 to 64 overlap each other when seen in a top view. Thereby, the hall element 100 is formed.

Meanwhile, here, a step of forming the contact portions 51 to 54 is performed before a step of forming the insulating film 40, but a step of forming the contact portions 51 to 54 may be performed after a step of forming the insulating film 40.

In the above-described embodiment, a description has been given of a case where the ball portions 61 to 64 are respectively provided in the four electrode portions 31 to 34, but is not limited thereto. For example, the ball portions may be provided in any one electrode portion. In addition, the ball portions can also be provided in, for example, only an electrode portion for output or an electrode portion for input.

In the embodiment, a description has been given of a case where the contact portions 51 to 54 are disposed at the corner portions of the magnetosensitive portion 20, but is not limited thereto. The contact portions 51 to 54 may be disposed so as to have any positional relationship with the magnetosensitive portion 20 as long as a region surrounded by the four contact portions 51 to 54 is disposed to be included within the magnetosensitive portion 20 when seen in a top view.

While the embodiment of the invention has been described, the embodiment is illustrative of a device and a method for embodying the technical idea of the invention. The technical idea of the invention does not specify materials, shapes, structures, arrangement, and the like of components. Various modifications can be made to the technical idea of the invention within the technical scope specified by claims.

DESCRIPTION OF REFERENCE NUMERALS

10: substrate
20: magnetosensitive portion
21: conductive layer
22: surface layer
31 to 34: electrode portion
40: insulating film
51 to 54: contact portion
61 to 64: ball portion
100: hall element
200: Hall sensor
211 to 214: lead terminal
251 to 254: bonding wire
230: mold member

What is claimed is:

1. A hall element comprising:
a substrate;
a magnetosensitive portion formed on the substrate;
an insulating film formed on the magnetosensitive portion;
four conductive portions configured formed on the insulating film and electrically connected to the magnetosensitive portion through the insulating film; and
ball portions connected to the conductive portions,
wherein at least one of the ball portions is disposed on a diagonal line of a quadrangle formed by a region surrounded by the four conductive portions and is disposed above a region covering a portion where the magnetosensitive portion, the conductive portions and the insulating film are in contact with each other in view of a cross section.

2. The hall element according to claim 1,
wherein the ball portions are disposed above a portion where the insulating film is in contact with at least one of the conductive portions which are positioned on the same diagonal line among the four conductive portions and included in at least one conductive portion pair.

3. The hall element according to claim 1,
wherein the ball portions are disposed above a portion where the insulating film is in contact with each of the four conductive portions.

4. The hall element according to claim 1,
wherein the conductive portion includes
an electrode portion formed on the insulating film to extend in a direction in which the conductive portions are close to each other, and a contact portion electrically connecting the electrode portion and the magnetosensitive portion to each other through the insulating film, wherein the ball portion is disposed on the diagonal line of the quadrangle and above the region covering the portion where the magnetosensitive portion, the conductive portions and the insulating film are in contact with each other in view of the cross section.

5. The hall element according to claim 1,
wherein the magnetosensitive portion has a quadrangular shape, and
wherein the conductive portions are disposed at corner portions of the magnetosensitive portion, respectively.

6. The hall element according to claim 2,
wherein each of the conductive portions includes
an electrode portion formed on the insulating film to extend in a direction in which the conductive portions are close to each other, and
a contact portion electrically connecting the electrode portion and the magnetosensitive portion to each other through the insulating film,
wherein the ball portion is disposed on the diagonal line of the quadrangle and above a portion where the contact portion and the insulating film are in contact with each other.

7. The hall element according to claim 3,
wherein each of the conductive portions includes
an electrode portion formed on the insulating film to extend in a direction in which the conductive portions are close to each other, and
a contact portion electrically connecting the electrode portion and the magnetosensitive portion to each other through the insulating film,
wherein the ball portion is disposed on the diagonal line of the quadrangle and above the region covering the portion where the magnetosensitive portion, the conductive portions and the insulating film are in contact with each other in view of the cross section.

8. The hall element according to claim 2,
wherein the magnetosensitive portion has a quadrangular shape, and
wherein the conductive portions are disposed at corner portions of the magnetosensitive portion, respectively.

9. The hall element according to claim 3,
wherein the magnetosensitive portion has a quadrangular shape, and
wherein the conductive portions are disposed at corner portions of the magnetosensitive portion, respectively.

10. The hall element according to claim 4,
wherein the magnetosensitive portion has a quadrangular shape, and
wherein the conductive portions are disposed at corner portions of the magnetosensitive portion, respectively.

11. The hall element according to claim 6,
wherein the magnetosensitive portion has a quadrangular shape, and
wherein the conductive portions are disposed at corner portions of the magnetosensitive portion, respectively.

12. The hall element according to claim 7,
wherein the magnetosensitive portion has a quadrangular shape, and
wherein the conductive portions are disposed at corner portions of the magnetosensitive portion, respectively.

* * * * *